(12) United States Patent
Burghy

(10) Patent No.: US 11,158,219 B2
(45) Date of Patent: Oct. 26, 2021

(54) EXTERIOR LIGHTING IN AIRCRAFT LIVERY

(71) Applicant: The Boeing Company, Chicago, IL (US)

(72) Inventor: Rebecca Estelle Burghy, Everett, WA (US)

(73) Assignee: The Boeing Company, Chicago, IL (US)

(*) Notice: Subject to any disclaimer, the term of this patent is extended or adjusted under 35 U.S.C. 154(b) by 183 days.

(21) Appl. No.: 16/556,394

(22) Filed: Aug. 30, 2019

(65) Prior Publication Data

US 2021/0065594 A1 Mar. 4, 2021

(51) Int. Cl.
| | | |
|---|---|---|
| G09F 21/00 | (2006.01) | |
| G09F 21/10 | (2006.01) | |
| H05K 1/18 | (2006.01) | |
| H05K 3/28 | (2006.01) | |
| G09F 9/33 | (2006.01) | |
| B60Q 1/26 | (2006.01) | |
| G09G 3/32 | (2016.01) | |

(52) U.S. Cl.
CPC ........... G09F 21/10 (2013.01); B60Q 1/2696 (2013.01); G09F 9/33 (2013.01); G09G 3/32 (2013.01); H05K 1/182 (2013.01); H05K 3/284 (2013.01); B60Q 2400/10 (2013.01); G09G 2380/12 (2013.01); H05K 2201/10106 (2013.01); H05K 2201/10128 (2013.01); H05K 2201/10522 (2013.01)

(58) Field of Classification Search
CPC ......... G09F 21/10; G09F 9/33; B60Q 1/2696; H05K 1/182; G09G 3/32
See application file for complete search history.

(56) References Cited

U.S. PATENT DOCUMENTS

| | | | | |
|---|---|---|---|---|
| 6,040,618 | A | * | 3/2000 | Akram .................... H01L 23/13 257/586 |
| 8,033,684 | B2 | | 10/2011 | Marshall et al. |
| 8,332,084 | B1 | | 12/2012 | Bailey et al. |
| 8,944,658 | B1 | | 2/2015 | Madhav et al. |
| 2008/0225553 | A1 | * | 9/2008 | Roberts ................. H05B 33/22 362/559 |
| 2009/0008057 | A1 | | 1/2009 | Cordes et al. |
| 2009/0059609 | A1 | * | 3/2009 | Marshall .................. F21K 9/00 362/470 |
| 2017/0136944 | A1 | * | 5/2017 | Duce ....................... F21S 43/00 |
| 2017/0142523 | A1 | * | 5/2017 | Schalla .................. H04R 1/025 |
| 2017/0341571 | A1 | * | 11/2017 | Salter ..................... B60Q 1/323 |
| 2017/0349090 | A1 | * | 12/2017 | Dellock .................. C03C 17/00 |
| 2018/0204490 | A1 | * | 7/2018 | De Brouwer .......... B64D 47/02 |
| 2018/0368269 | A1 | | 12/2018 | Johnston et al. |
| 2019/0042030 | A1 | * | 2/2019 | Saaski ...................... B32B 3/30 |
| 2019/0144132 | A1 | * | 5/2019 | Jha ........................ H05B 45/58 362/470 |

(Continued)

FOREIGN PATENT DOCUMENTS

WO 2009029457 A1 3/2009

*Primary Examiner* — Gerald J Sufleta, II

(74) *Attorney, Agent, or Firm* — Coats & Bennett, PLLC

(57) ABSTRACT

Methods, systems and apparatuses are disclosed for incorporating an illumination assembly comprising a plurality of micro-light sources into an exterior surface of a vehicle for the purpose of producing predetermined fixed or sequenced visual images.

27 Claims, 7 Drawing Sheets

(56) References Cited

U.S. PATENT DOCUMENTS

| | | | | |
|---|---|---|---|---|
| 2019/0256223 A1* | 8/2019 | Depta | ................... | B64D 47/06 |
| 2019/0383474 A1* | 12/2019 | Vasylyev | .................. | F21V 9/30 |
| 2020/0017236 A1* | 1/2020 | Scheidler | ................ | G09F 21/10 |
| 2021/0061167 A1* | 3/2021 | Messenger | .............. | G09F 13/04 |
| 2021/0136966 A1* | 5/2021 | Jang | ..................... | H05K 13/041 |

* cited by examiner

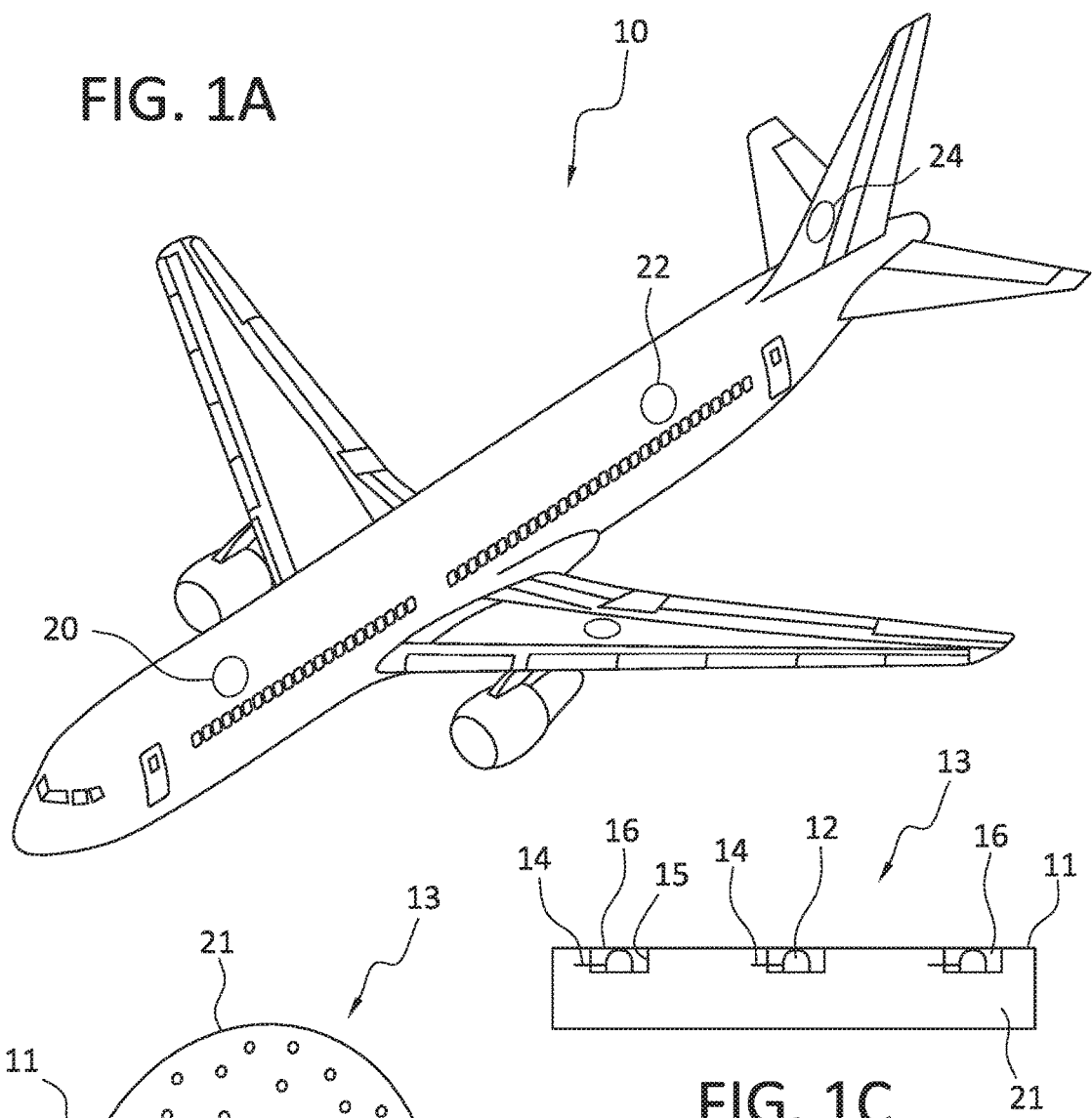
FIG. 1A
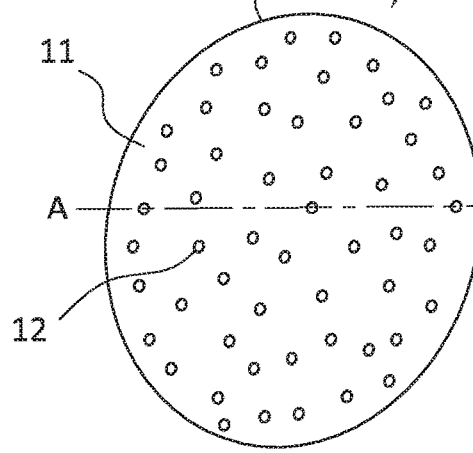
FIG. 1B
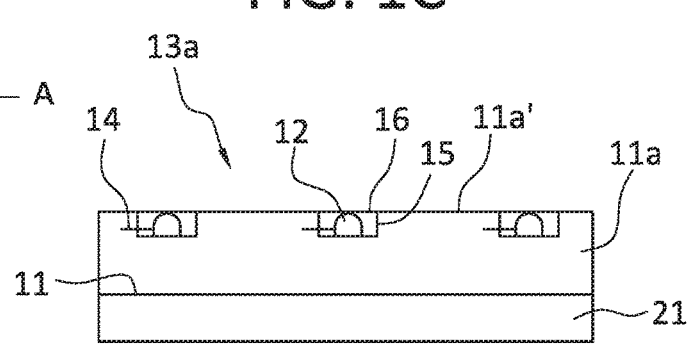
FIG. 1C
FIG. 1D

EXTERIOR LIGHTING IN AIRCRAFT LIVERY

TECHNOLOGICAL FIELD

The present disclosure relates generally to the field of exterior lighting, or liveries, for vehicles. More specifically the present disclosure relates to the methods, systems, and apparatuses for customizing the exterior lighting, or liveries, of aircraft.

BACKGROUND

Branding and product identification are important to most industries. The adoption of identifying insignias or logos on various products can inspire customer loyalty and otherwise readily identifies a product, source of origin, etc., and can allow the public to associate the product with the company owing or manufacturing the product so identified by the markings disposed thereon. In some cases, the outward appearance of a product can have multiple uses in addition to building brand loyalty and name recognition.

The assemblage on an aircraft exterior of decorative and non-decorative markings, colors, logo, insignias, and overall appearance of the aircraft exterior is collectively known as an aircraft "livery". The livery on an aircraft can be applied by a manufacturer to a customer's specifications, and can result is elaborate designs and paint jobs, often to further the corporate branding goals, etc.

SUMMARY

The present application discloses a substrate, with the substrate including a substrate exterior. The substrate can include a coating layer disposed on the substrate exterior, and with at least one coating layer on the substrate exterior, and a plurality of light sources incorporated in at least one of: the substrate exterior, the coating layer, or combinations thereof. At least one of the substrate exterior, the coating, or combinations thereof further includes a power source, a plurality of electrically conductive traces written into at least one of: the substrate exterior, the coating layer, or combinations thereof. The plurality of electrically conductive traces is in communication with the plurality of light sources. Each of the plurality of electrically conductive traces is further in communication with the power source.

In another aspect, a controller is further optionally in communication with at least one of the plurality of electrically conductive traces, the power source, or combinations thereof.

In another aspect, the plurality of light sources includes at least one of: a plurality of light emitting diodes (LEDs), a plurality of organic light emitting diodes (organic LEDs), or combinations thereof.

In another aspect, the light sources are embedded in at least one of the substrate exterior, the coating layer, or combinations thereof In a further aspect, the coating layer can be a film layer that can be configured to be a flexible film layer.

According to further aspects, the controller or other electronics are configured to send illumination signals and/or illuminations signal sequences to the plurality of light sources.

In other aspects, the light sources are substantially encased in at least one of the substrate exterior, the coating layer, or combinations thereof.

In another aspect, at least one of the substrate exterior, the coating layer, or combinations thereof each have a light transmissivity of at least about 30%. Preferably, the material that can be an exterior substrate material or a coating layer material has a light transmissivity ranging from about 30% to about 70%.

In another aspect, the coating layer can be substantially transparent with the coating layer material having a light transmissivity of greater than about 90%.

In another aspect, the plurality of light sources includes at least one of; light emitting diodes organic light emitting diodes, or combinations thereof.

In another aspect, the exterior coating layer can include a flexible film.

in a further aspect, the exterior coating is a film layer that can substantially encase at least a portion of the substrate exterior.

In a further aspect, the light sources have an average lateral dimension ranging from about 50 μm×50 μm to about 100 μm×100 μm.

In a further aspect, the plurality of light sources each comprise at least one light source lead, with the light source lead in communication with at least one electrically conductive trace.

In another aspect, at least one of a component, a subassembly, or, for example, a vehicle, includes the substrate including a coating layer disposed on the substrate exterior, and a plurality of light sources incorporated in at least one of: the substrate exterior or a coating layer disposed directly or indirectly on the substrate exterior. One or more coating layers can be disposed onto the substrate exterior, and at least one coating layer can be a film layer. The light sources can be incorporated into one or more the substrate exterior surface, one or more coating layers, or combinations thereof. A power source is in communication with a plurality of electrically conductive traces written into at least one of: the substrate exterior or a coating layer disposed directly or indirectly onto the substrate exterior surface. The plurality of electrically conductive traces is further in communication with the light sources.

A controller is further optionally in communication with at least one of the plurality of electrically conductive traces, the power source, or combinations thereof.

In another aspect, vehicle is selected from the group including at least one of: a manned aircraft, an unmanned aircraft, a manned spacecraft, an unmanned spacecraft, a manned rotorcraft, an unmanned rotorcraft, a manned terrestrial vehicle, an unmanned terrestrial vehicle; a manned surface water borne vehicle, an unmanned waterborne vehicle, a manned sub-surface water borne vehicle, a satellite, or combinations thereof.

According to another aspect, an exterior lighting system for a substrate exterior (comprising an exterior lighting assembly) is disclosed, with the exterior lighting system including a substrate, with the substrate including a substrate exterior, a coating layer disposed to contact the substrate exterior, and a plurality of light sources incorporated in at least one of: the substrate exterior, the coating layer, or combinations thereof. The system further includes a plurality of electrically conductive traces written into at least one of: the substrate exterior, the coating layer, or combinations thereof, with the plurality of electrically conductive traces in communication with the plurality of light sources. The exterior lighting system for a substrate exterior further includes a power source that can be an electrical power source, and the plurality of electrically conductive traces is further in communication with the power source. A controller is further optionally in communication with at least one of the plurality of electrically conductive traces, with the power source or combinations thereof.

According to a further aspect, a coating layer is disclosed including a plurality of light sources incorporated into the coating layer and a plurality of electrically conductive traces written into at least one of: a substrate exterior, the coating layer, or combinations thereof, with the plurality of electrically conductive traces in communication with the plurality of light sources.

In another aspect, the plurality of light sources embedded in the coating layer.

In a further aspect, the coating layer includes a film coating layer.

In another aspect, the film coating layer is made from a material including at least one of: polyetherimide, polyester, polycarbonate, polypropylene, polyphenylene sulfide, toughened polyurethane, polyether ether ketone, or combinations thereof.

In another aspect, the film layer has a light transmissivity ranging from about of at least about 30% to about 70%.

In a another aspect, a method is disclosed for producing an illuminated image on the exterior of a vehicle, with the method including incorporating a lighting system into a vehicle exterior, with the lighting system including a plurality of light sources incorporated in at least one of the substrate material exterior, a coating layer disposed directly or indirectly on the substrate material exterior, or combinations thereof. A plurality of electrically conductive traces written into at least one of the substrate material exterior or the layer disposed on the substrate material exterior, with the plurality of electrically conductive traces in communication with the plurality of light sources, and further in communication with a power source. The method further includes sending a signal from at least one of the power source or a controller, controlling the illumination of the plurality of light sources, activating one or more of the plurality of light sources, and producing a predetermined illuminated image on vehicle exterior.

In another aspect, the predetermined illuminated image on vehicle exterior forms at least one of an advertisement, a customized message, an animated message, or combinations thereof.

In another aspect, the plurality of light sources is substantially encased in a material, with the material having a light transmissivity greater than about 30%.

In another aspect, the plurality of light sources is substantially encased in a material, with the material having a light transmissivity ranging from about 30% to about 70%.

In another aspect, a disclosed method further includes sequencing the signals from the power source or sequencing the signals from the controller to the plurality of light sources.

In another aspect, the sequencing is a programmable sequence.

In a further aspect, the controller regulates the programmable sequence.

In another aspect, the method includes embedding the plurality of light sources in at least one of the substrate exterior, the coating layer, or combinations thereof.

In a further aspect, the method includes a film coating layer.

The features, functions and advantages that have been discussed can be achieved independently in various aspects or may be combined in other aspects, further details of which can be seen with reference to the following description and the drawings.

BRIEF DESCRIPTION OF THE DRAWINGS

Having thus described variations of the disclosure in general terms, reference will now be made to the accompanying drawings, which are not necessarily drawn to scale, and wherein:

FIG. 1A is an illustration of a vehicle in the form of an aircraft comprising exterior lighting assemblies according to a present aspect;

FIG. 1B is an illustration of an enlarged section of a vehicle exterior in the form of an aircraft exterior showing an exterior view of exterior lighting assemblies according to a present aspect;

FIG. 1C is a cross-sectional view of the view shown in FIG. 1B taken along line A-A.

FIG. 1D is a cross-sectional view of the view shown in FIG. 1B taken along line A-A.

Figure 2:
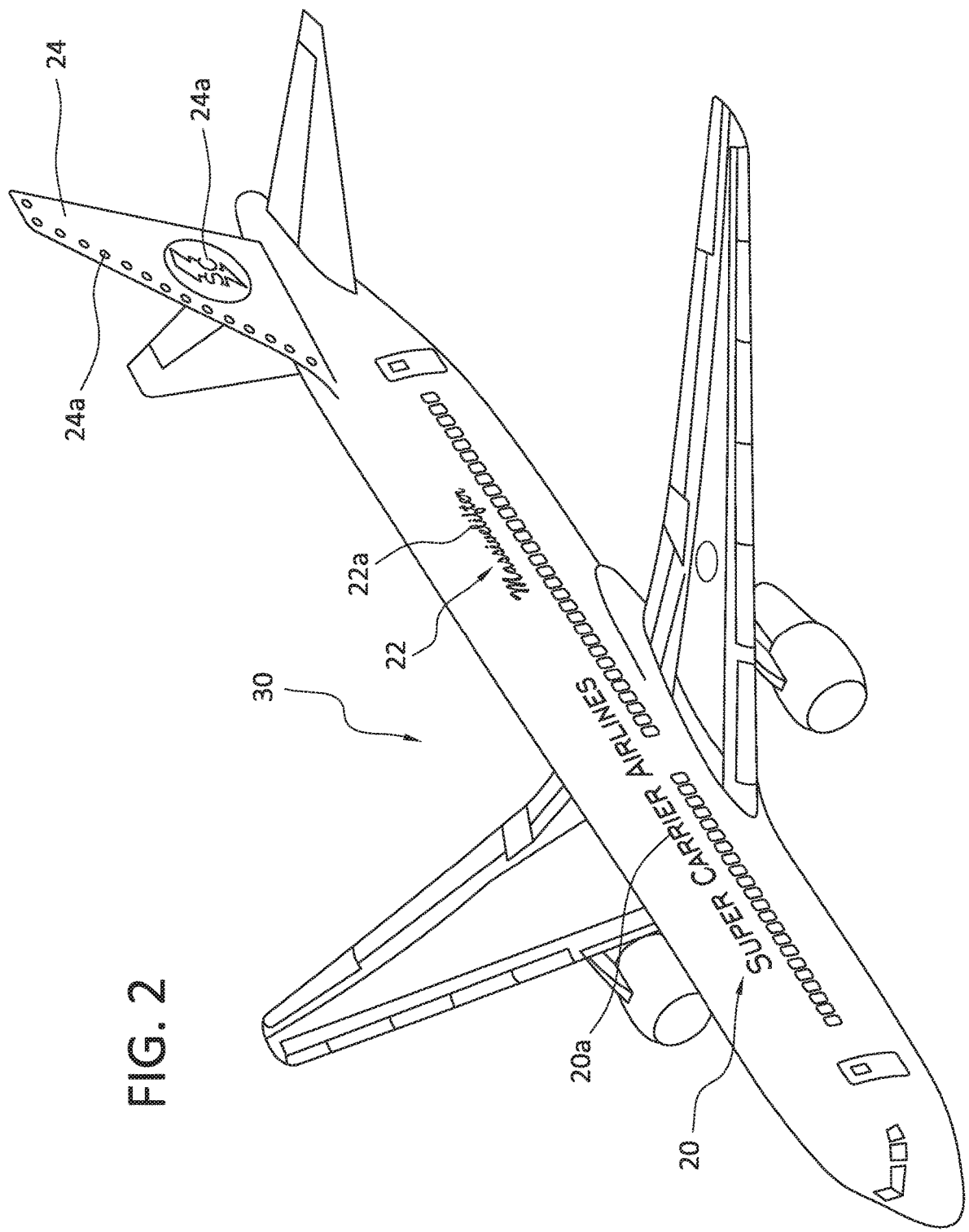
Figure 3:
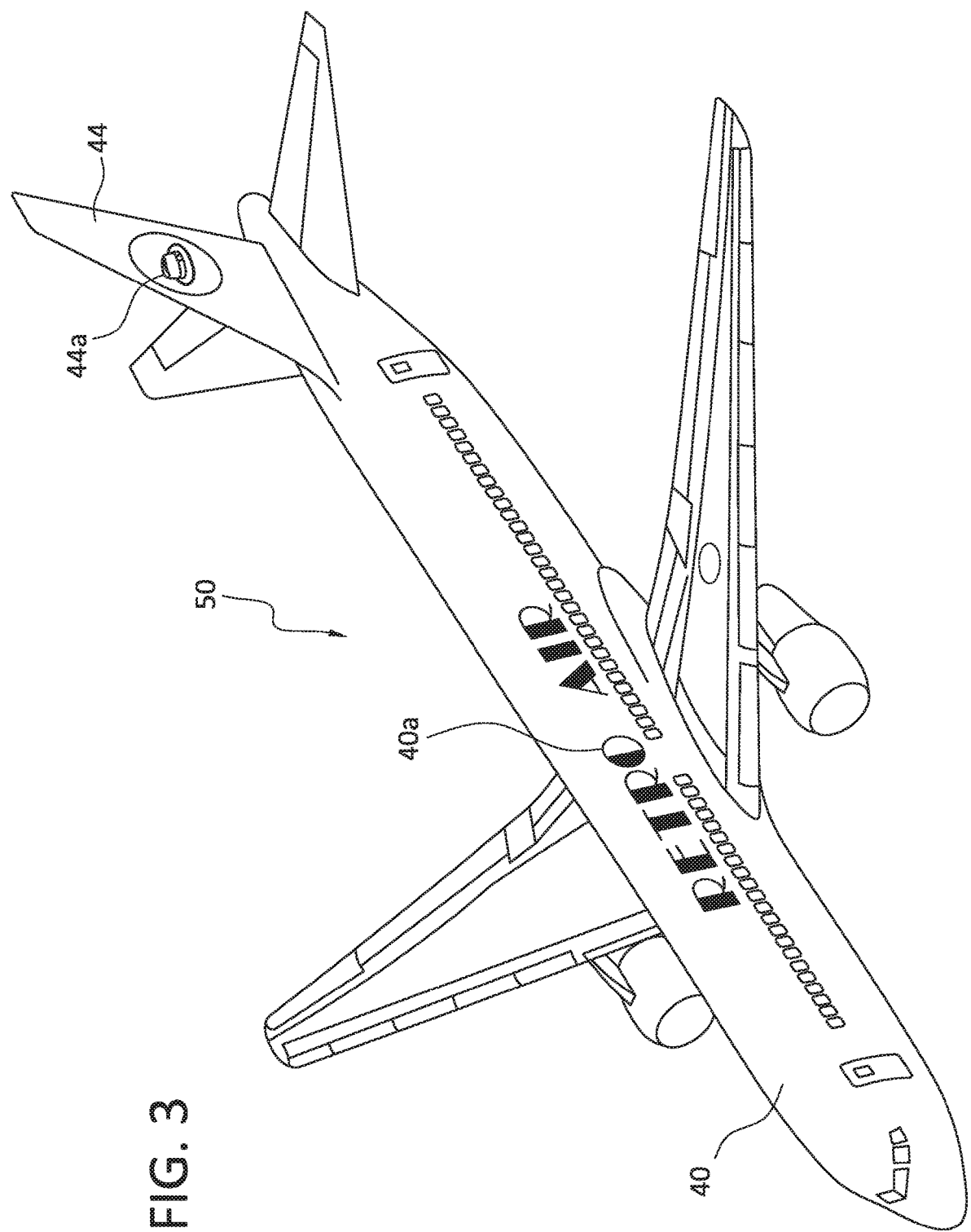
Figure 4:
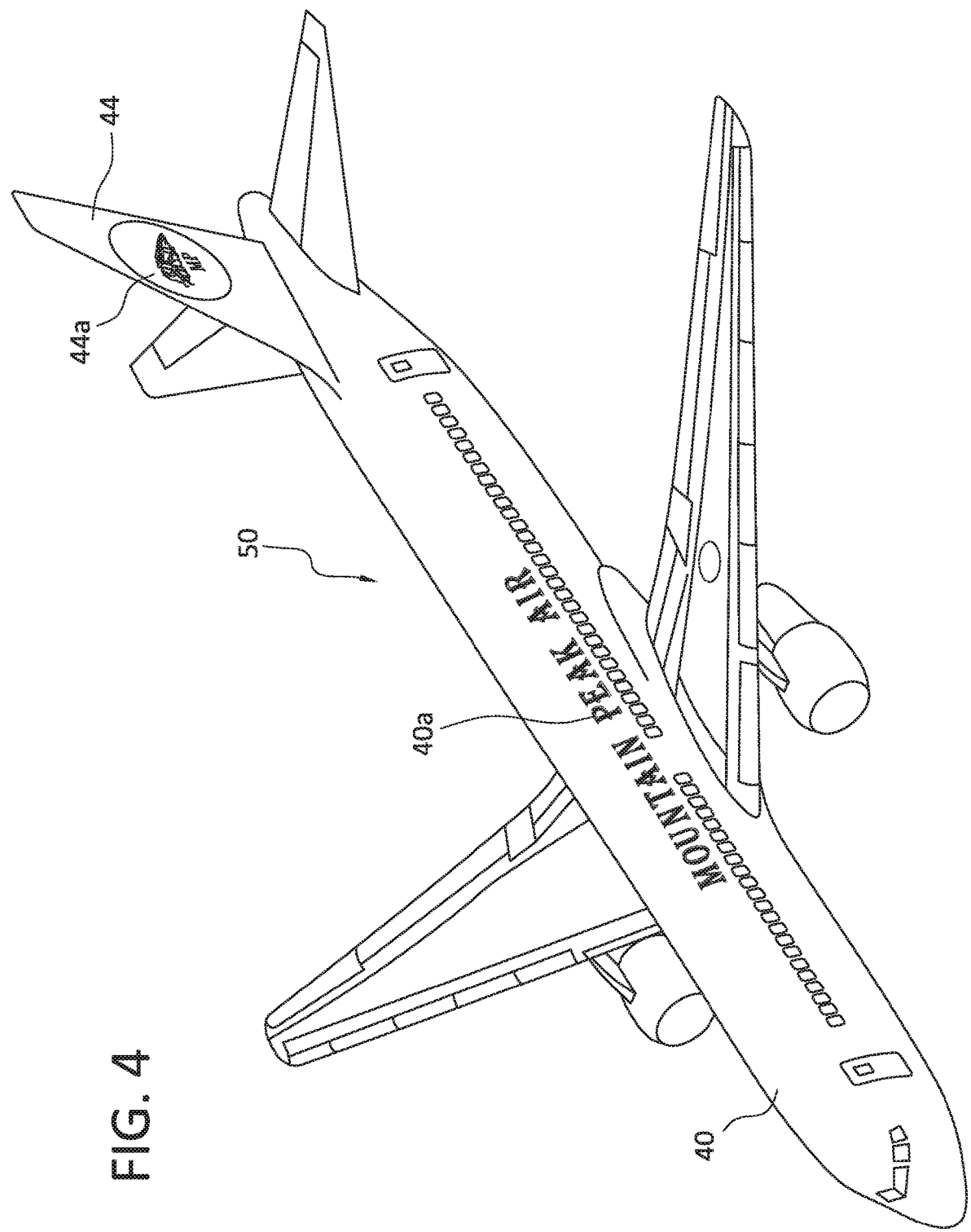
Figure 5A:
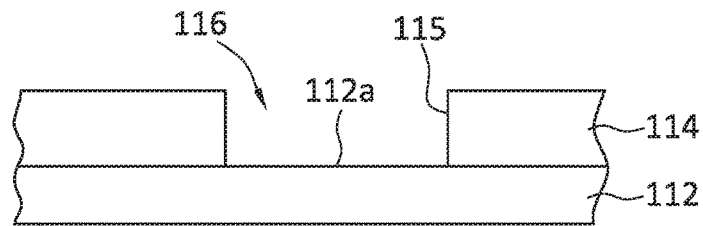
Figure 5B:
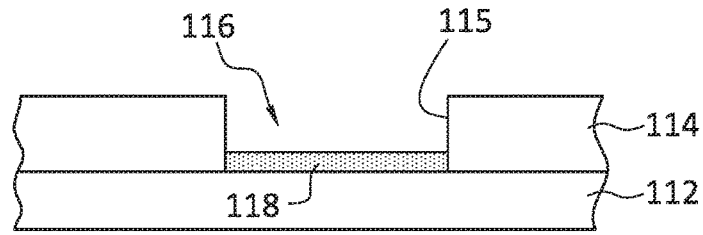
Figure 5C:
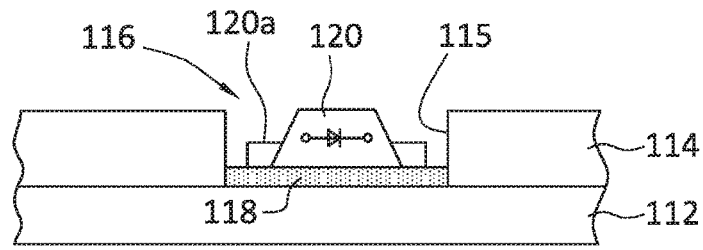
Figure 5D:
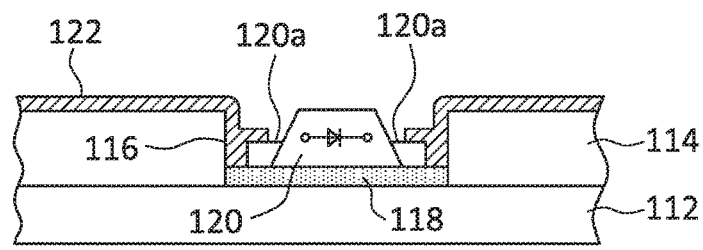
Figure 5E:
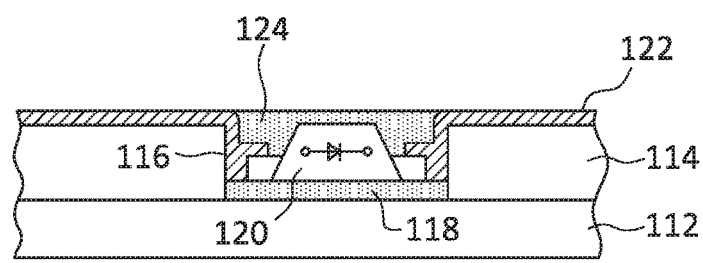
Figure 5F:
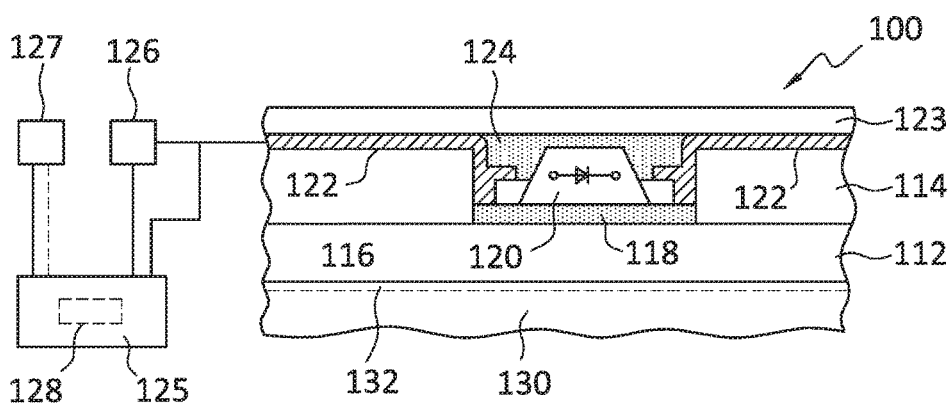
Figure 6:
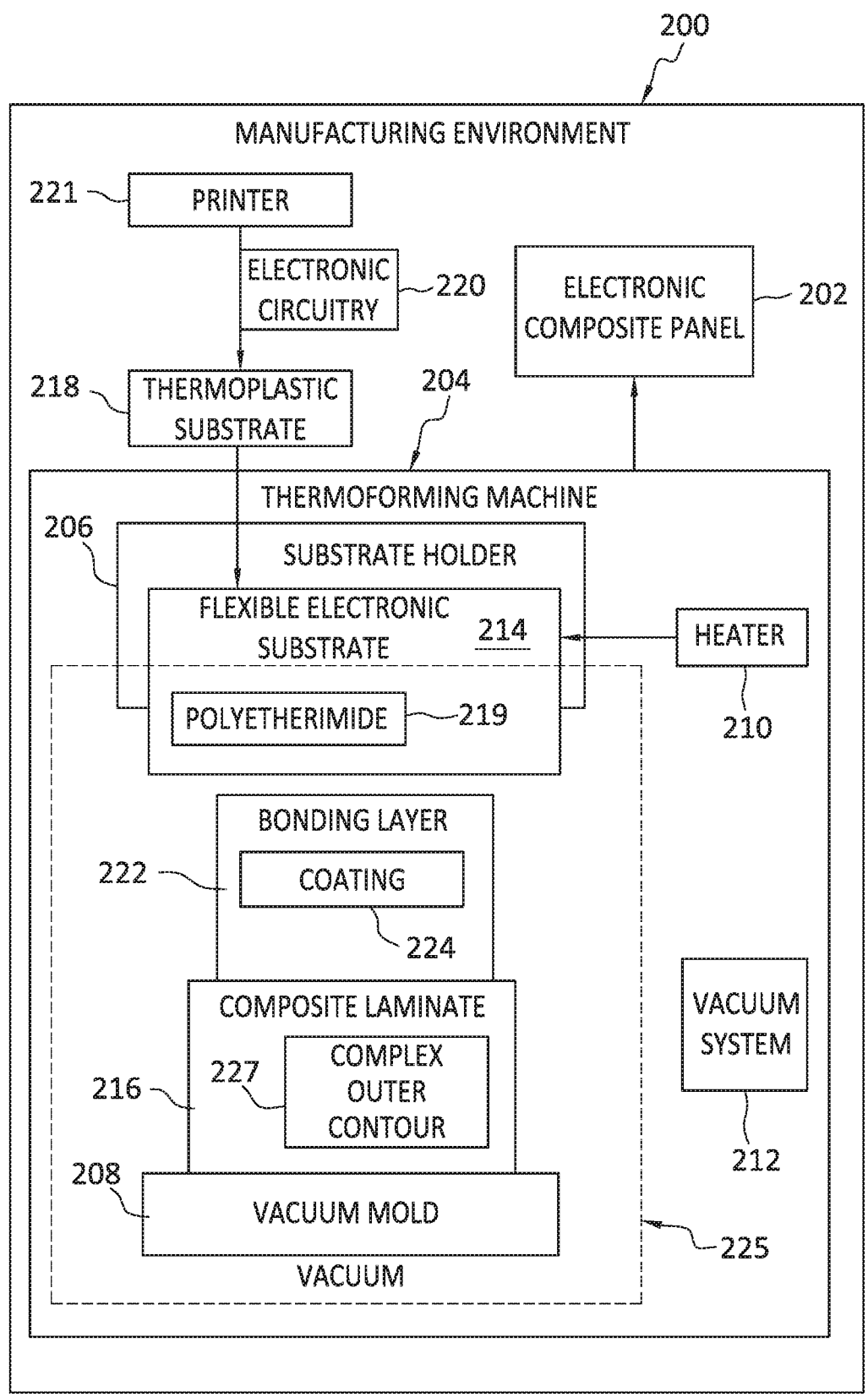
Figure 7:
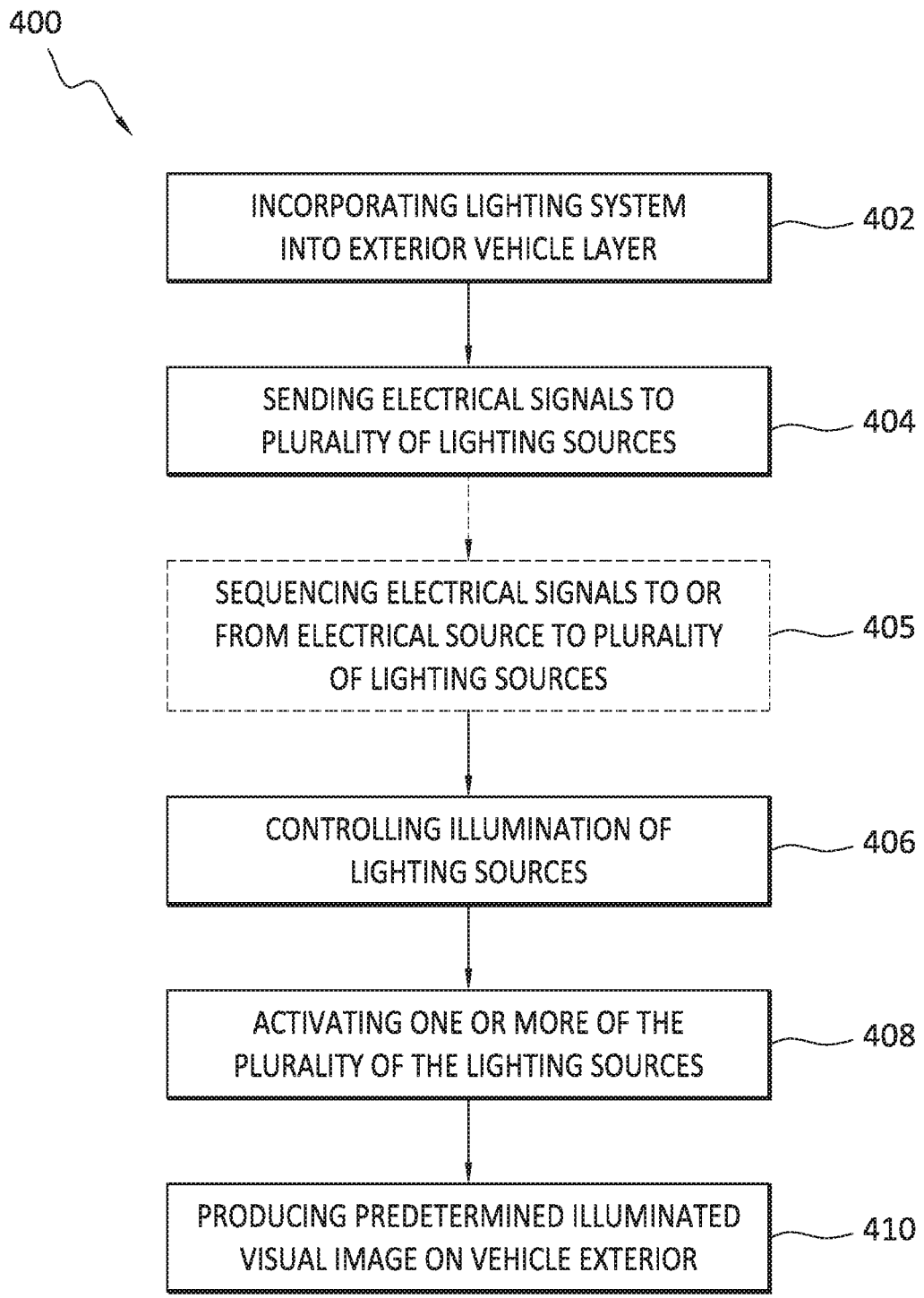

FIG. 2 is an illustration of a vehicle in the form of an aircraft comprising exterior lighting assemblies according to a present aspect;

FIG. 3 is an illustration of a vehicle in the form of an aircraft comprising exterior lighting assemblies according to a present aspect;

FIG. 4 is an illustration of a vehicle in the form of an aircraft comprising exterior lighting assemblies according to a present aspect;

FIG. 5A is a partial cross-sectional view of a lighting assembly according to present aspects;

FIG. 5B is a partial cross-sectional view of a lighting assembly according to present aspects;

FIG. 5C is a partial cross-sectional view of a lighting assembly according to present aspects;

FIG. 5D is a partial cross-sectional view of a lighting assembly according to present aspects;

FIG. 5E is a partial cross-sectional view of a lighting assembly according to present aspects;

FIG. 5F is a partial cross-sectional view of a lighting assembly according to present aspects;

FIG. 6 is a block diagram illustrating systems according to present aspects; and FIG. 7 is a flowchart outlining a method according to present aspects.

DETAILED DESCRIPTION

Passenger airlines and air freight carriers maintain fleets of aircraft that often remain in service for a duration that can extend beyond the limits of various external decorative and non-decorative coatings, including paint coatings that can incorporate elaborate exterior liveries. During the lifetime of an aircraft, the liveries may need to be updated, changed to incorporate new designs or logos, changed to reflect new aircraft ownership, etc. In addition, environmental factors that confront an aircraft exterior can result in an aircraft being taken out of service to update, replace, rework, or augment an aircraft livery through the application of a fresh exterior coating.

In competitive industries, including the passenger aircraft industry, customer satisfaction is paramount. Accordingly, offering customers fresh, clean aircraft with attractive liveries is highly desirable. While aircraft liveries can visibly convey visual images to passengers and potential passengers during daylight hours, the liveries of aircraft are not as apparent during evening hours, even if directed lights from the ground or spotlights from locations on the aircraft directed toward the aircraft are sometimes directed to portions of an aircraft livery while the aircraft is at the gate, or is landing, taking off or taxiing on a runway, etc.

Present aspects are directed to improving the appearance and visibility of aircraft liveries, especially at nighttime, by providing customizable illumination capabilities to aircraft exteriors by incorporating lighting arrays into aircraft exteriors.

When an aircraft comprises, for example, a composite material exterior, present aspects contemplate integrating and otherwise incorporating electronics and lighting fixtures into an exterior layer of a composite material substrate, or into or onto at least one coating layer that can be an exterior coating layer. The at least one coating layer can be co-cured, co-bonded, secondarily bonded, or otherwise applied to the aircraft exterior surface. Accordingly, present aspects contemplate manufacturing composite structures having exterior composite substrate surfaces and assemblies comprising the exterior composite substrate surfaces, as well as exterior coatings (that can be applied to the exterior substrate surfaces) with incorporated electronic circuitry (e.g., microelectronic circuits) in communication with incorporated lighting fixtures. Lighting fixtures are equivalently referred to herein as "light sources" or "lighting sources". According to present aspects, the circuitry and lighting fixtures are integrated into a substrate exterior or into one or more coating layers applied to a substrate exterior, with the substrate exterior being a vehicle exterior and, preferably an aircraft exterior.

Further aspects include printing or "writing" electronic circuitry onto or into composite material layers, or printing or "writing" electronic circuitry onto or into coating layers (e.g., thermoplastic material layers, thermoset material layers, etc.) that can be co-cured, secondarily cured, or co-bonded onto composite material exteriors, including using a heating and forming process that can be a single heating and forming process.

In one aspect, a coating layer, that can be a flexible coating material film, can comprise incorporated electronic circuitry and incorporated light sources in communication with the incorporated electronic circuitry. The coating layer can be positioned or otherwise oriented proximate to the exterior of a substrate exterior surface such as, for example, a composite laminate substrate. According to present aspects, the composite laminate substrate can be, for example, an epoxy-based composite substrate exterior. Further present aspects contemplate use of an applied vacuum to cause the flexible coating layer (if present), that can be a flexible coating material film or film layer, to conform to a desired or predetermined geometry of a composite substrate material exterior (e.g., a substrate exterior surface) to form an integrated electronic composite substrate panel.

According to other present aspects, complex contoured composite materials, including a composite laminate material can be manufactured to incorporate integrated electronic circuitry for the purpose of forming a customized illuminated aircraft livery.

According to one non-limiting manufacturing method and system, composite material plies can be layed up as a composite laminate, for example, on a vacuum mold, with the mold or other composite tooling (e.g. mandrel, etc.) comprising a complex geometry that can be, for example, an irregular geometry, a contoured geometry, a planar geometry, combinations thereof, etc., such that a predetermined portion or region of an aircraft exterior can be fashioned into any predetermined or desired exterior geometry.

Depending on the predetermined dimensions of the electronic circuitry and the predetermined or desired dimensions of the lighting fixtures to be integrated into an aircraft exterior substrate material, various methods can be used to integrate the electronic circuitry and the lighting fixtures into or onto the substrate material exterior, or into coatings that can be applied to a substrate material exterior. For example, printing technology, including inkjet printing, spray deposition techniques, etc., can be used to deposit the predetermined electronic circuit onto or into a material used as the substrate exterior material (or printed into or onto coatings applied to the substrate exterior material) used to form, for example, an aircraft exterior.

As stated above, and according to a present aspect, the electronic circuits and/or the light sources can be oriented onto or into a layer of composite material. Alternatively, the electronic circuits and/or the light sources can be oriented onto or into a layer of, for example a coating that can be a film (e.g., a thermoplastic film or thermosetting film), and the film can then be disposed onto the composite material substrate exterior and that can be co-cured, secondarily cured with the composite material substrate exterior, or that can be co-bonded or otherwise adhered to the composite substrate material exterior.

According to present aspects, the films containing the lighting array (e.g. the light sources and supporting circuitry, etc.) can be treated with a pressure sensitive adhesive robust enough to maintain the coating film in a desired or predetermined orientation and location on a substrate exterior surface. When the lighting arrays of the present disclosure are used in connection with aircraft and other high-speed vehicles, according to present aspects, the coatings adhered into position can incorporate a topcoat or cover layer (e.g., outermost exterior layer) to protect the films containing the lighting arrays from damage due to rain, hail, particulate impact, de-icing procedures, chemical degradation (e.g., from exposure to fuels, hydraulic fluids, cleaning solutions, etc.).

In one aspect, the circuits and/or the light sources are oriented onto or into a coating layer of, for example a thermoplastic film or thermosetting film that can then be disposed onto the composite material substrate exterior, the thermoplastic layer can be a film having a thickness ranging from about 2 mils to about 5 mils (about 65 to about 100 μm). The coating layer and can be made from a variety of thermoplastic materials including, for example, and without limitation polyetherimide (PET), polyester, polycarbonate, polypropylene, polyphenylene sulfide, etc. or combinations thereof. Where durability and performance protection are a significant factor, present aspects contemplate using coating layer films comprising silicone, toughened polyurethane (TPU), polyether ether ketone (PEEK), Ultem® polyetherimide, or the like, alone or in combination. According to present aspects, protective coating layers used to cover or coat the coating layers that incorporates the light sources and circuitry can have a thickness ranging from about 2 mils to about 5 mils, or thicker.

According to further aspects, the coating layer (that can contain or otherwise act as a supporting medium for) the light sources and the electrical circuits) can be made into and oriented onto a substrate exterior surface and applied to the substrate exterior surface as a liquid, a film, a film sheet, a spray, etc. When the coating layer is applied as a film sheet, according to further aspects, the coating layer film sheet can be a partial or a substantially complete "overwrap". A virtually complete overwrap refers to a coating layer film that can substantially encase (e.g., greater than about 95%, etc.) the substrate exterior surface to which the overwrap is applied. When the coating layer is configured into an overwrap, the material itself or with the assistance of an additional adhesive layer can be secured to the substrate exterior surface through after-bonding, or otherwise adhering the overwrap, including, if necessary, with the additional application of heat, vacuum, etc.

According to further aspect, electronic circuitry can be applied onto the thermoplastic layer (e.g., by direct wire process, etc.) using a printer, including, for example, and without limitation, printers used in connection with additive manufacturing, for example, to 3-D print electronic circuitry onto a thin thermoplastic layer, that can be a thin thermoplastic film layer. Such printed circuit technology can form flexible electronic circuitry into and onto single layer or multi-layer film substrates including, for example, thermoplastic films to be applied to composite material substrates, or, if desired, the printed circuits can be printed onto the composite materials with thermoplastic layers or other layers applied to protect the layer comprising the printed electronic circuits.

Vacuum systems can be used, for example, with curing and molding protocols to conform a composite laminate and/or a thermosetting layer to conform to a predetermined or desired contour or other predetermined or desired geometry. The combined heat and vacuum protocols can be maintained until the layer or layers comprising the electronic circuits and light source components are bonded or otherwise adhered to a composite laminate substrate exterior. Further layers, surface treatments, additives, surfacing protocols, etc., can be included, for example and without limitation, in the case where electronic circuitry is printed onto a layer that does not itself bond to a composite material, substrate or other material substrate (e.g., a metallic or other non-metallic substrate material) but that can be indirectly bonded with, for example, the aid of an adhesive or other material layer able to bond to a composite material or other material substrates, and also bond to the layer comprising the electronic circuitry, etc.

According to present aspects, lighting systems incorporated into exterior surface structures and substrate materials of, for example, an aircraft can emit customized images that can enhance an airline's "brand", for example, making the carrier's name and/or logos visible during nighttime. In addition, according to present aspects, lighting systems incorporated into exterior surface structures and substrate materials of, for example, an aircraft, can emit customized images or messages such as, for example, warning messaging, directional messaging, gate destination messaging, emergency messaging, etc., including messaging that would be useful for ground control personnel relative to procedures encountered by an aircraft during arrival/gate approaches, or during departure/gate disembarkation, taxiing, or other aircraft maneuvers while on the ground, etc.

Further aspects contemplate carriers being able to employ the present exterior surface lighting systems to customize messages, for example on an aircraft exterior surface, to announce or otherwise cater to, for example, a celebrity occupant, or to announce and advertise a special occasion, etc., (e.g., birthday, anniversary, group in attendance, touring band or professional sport team schedule, etc.).

Within and according to prevailing in-flight regulations, further aspects contemplate the presently disclosed lighting systems incorporated into substrate exterior surface, substrate structures components, substrate assemblies, etc., as displaying predetermined text messages, logos, indicia, insignias, scenes, artwork, images having the appearance of movement (e.g., through a programmed sequencing progression, including, for example, animation sequences, etc.) even while an aircraft is in flight, for example, to further enhance a carrier's brand or to identify a particular aircraft, or convey messaging specific particular to the aircraft or its occupants, or express or otherwise visually convey messaging or imaging time sold by or otherwise authorized by the carrier, etc.

According to further aspects, exterior lighting systems (equivalently referred to herein as "lighting arrays"), for example, for aircraft exteriors, etc., can include miniature or microminiature light emitting diodes (equivalently referred to herein as LEDs or micro-LEDs), or miniature or microminiature organic light emitting diodes (equivalently referred to herein as OLEDs or micro-OLEDs) with control and/or sequencing circuitry interconnected to (or otherwise in communication with) the LEDs and/or OLEDs and power sources that are also in communication with the LEDs and/or OLEDs. The presently disclosed lighting systems further include conductive traces that are printed or otherwise formed directly into and/or onto a coating layer bonded to an aircraft exterior substrate material. Alternatively, the conductive traces can be formed directly into or onto an aircraft composite material exterior and/or one or more coating layer(s) disposed onto the substrate exterior surface.

Present aspects envision using micro-LEDs and/or micro-OLEDs having an average lateral dimension ranging from about 50 µm×50 µm to about 100 µm×100 µm; and having an average height that is less than the average lateral dimension, and possibly having a height ranging from about 25 µm×25 µm to about 50 µm×50 µm. In a further aspect, the coating layer can be bonded to the composite material exterior in the form of, for example, a bonded applique (that can be applied in sections), or bonded or otherwise affixed overwrap that can be a single or substantially unitary (e.g. one piece, etc.) overwrap, etc.

The conductive traces can be circuit board-style conductive wiring traces, or patterns, that are formed directly on a substrate (e.g., a composite material substrate or a coating material layer, etc.) or onto a conductive trace coating surface through a "direct write" manufacturing method. In a further aspect, surface and/or sub-surface mounted micro-LEDs and/or micro-OLEDs are then covered or substantially encased by a substantially transparent coating comprising a thin flexible substantially transparent film that can be co-bonded, co-cured, or secondarily cured with the layers comprising the traces. As used herein, the term "substantially encased" with respect to the covering of the light sources (e.g., the micro-LEDs and/or micro-OLEDs, etc.) refers to the condition of coating the present light sources such that virtually no portion of the light sources are exposed to environmental conditions from a source external from, for example, an aircraft (e.g., rain, snow, hail, moisture, heat, freezing temps, etc.). However, a light source is also considered to be substantially encased even if a very small portion (e.g., a portion of the light source that connects to the conductive traces) is not covered by a coating material.

The substantially transparent coating can be a clear coat coating layer, or other transparent final or intermediate transparent coating layer in a typical layered aircraft exterior paint coating "stack". Typical transparent clear coats include, for example and without limitation, polyurethane materials (e.g., Desothane®—PPG Aerospace, etc.), polyacrylic materials, UV curing materials like Dupont 5018™, polychlorinated biphenyl-containing (PCB) conformal coat materials, etc.

According to one aspect, the protection afforded to the presently disclosed lighting systems including environmental protection of the light sources (e.g., micro-LEDs, etc.)

from external conditions and elements as described above can be effected, for example, by laminating one or more coatings of substantially transparent or even a translucent material over the light sources. For example, according to another aspect, coating materials can encase the present light sources via a low durometer rubber roller on a lamination machine to "seal" or otherwise substantially encase the light sources by applying, for example an appropriate thermoforming coating layer. Further present aspects contemplate other methods for encasing LEDs, including, for example, casting or spraying polymer coatings over coating layers that comprise the light sources, or over a substrate exterior surface that comprises the light sources.

According to present aspects, the term transparent refers to a material characteristic of the transmissivity of light through a material. As used herein, the term "transparent" means that light can pass through the material at a transmissivity greater than about 95%. The term "substantially transparent" means that material has a transmissivity that approaches 95% but may be less than 95%, and further has a transmissivity ranging from about 80% to 95%.

According to further aspects, the coating materials that substantially encase or otherwise surround and cover the light sources can have a light transmissivity that ranges from about 30% to about 70%. Present aspects further contemplate that, rather than being transparent, or substantially transparent, the coating materials that substantially encase or otherwise surround and cover the light sources can have an appearance of being light in color (e.g., white or near white in color, translucent, etc.) to better blend in with light colored paint, for example, on aircraft liveries. In this aspect, when the presently disclosed lighting systems are not in operation, the lighting systems would not be perceptible and would otherwise blend in with the overall appearance of the aircraft livery. Such light-colored coatings layers, that can be top coat layers, can have a light transmissivity as low as about 30%, and would allow the light sources to be visible through the coating layers when operable.

FIG. 1A shows a vehicle 10, in the non-limiting form of an aircraft, having illumination regions 20, 22, 24 positioned on the substrate exterior surface 11 of the vehicle 10. FIG. 1B is an enlarged view of the substrate exterior surface 11 of vehicle 10, showing an enlarged view of illumination region 20 comprising a plurality of light sources 12, with the various components and regions shown in FIGS. 1A and 1B described in more detail below. The terms "illumination sources" and "lighting sources" and "light sources" are used equivalently and interchangeably herein.

FIG. 1C shows a non-limiting cross-sectional side view of exterior lighting system and exterior lighting assembly 13 incorporated into substrate 21 taken across line A-A as shown in FIG. 1B (in an aspect where a coating layer is not present on the substrate exterior surface 11 of substrate 21). FIG. 1D shows a non-limiting cross-sectional side view of lighting assembly 13a incorporated into a coating layer 11a taken across line A-A as shown in FIG. 1B in an aspect where a coating layer 11a is present and oriented on and is otherwise proximate to the substrate exterior surface 11 of substrate 21.

As shown in FIG. 1C, recesses 16 bounded by recess walls 15 are fashioned into the substrate exterior surface 11 of substrate 21. Light source 12 is inserted into recess 16 with lead 14 in communication with light source 12.

As shown in FIG. 1D, exterior lighting system 13 (referred to equivalently herein as "an exterior lighting assembly") includes recesses 16 bounded by recess walls 15 are fashioned into the coating layer exterior surface 11a' of coating layer 11a that is presented to and oriented on and is otherwise proximate to the substrate exterior surface 11 of substrate 21. A light source 12 is inserted into recess 16 with lead 14 in communication with light source 12.

FIGS. 2, 3, and 4 are non-limiting representative illustration of vehicles in the form of aircraft comprising the lighting systems on the aircraft exterior according to present aspects. As shown in FIG. 2 an aircraft 30 has the illumination regions 20, 22, 24 as shown in FIG. 1A. When activated, according to present aspects, a plurality of light sources 12, or a plurality of groups of light sources 12 illuminate according to a sequence that can be a programmable sequence, controlled by a controller in the sequencer, or controlled by a separate controller for the purpose of forming a predetermined illuminated image, shown in FIG. 2, as illuminated visual images 20a, 22a, 24a on the exterior of vehicle 30; and shown in FIGS. 3 and 4 as illuminated visual images 40a, 44a located in illumination regions 40 and 44, respectively, on the exterior of vehicle 50. Controllers not shown in FIG. 2, 3, or 4.

FIG. 2 shows that the illumination regions 20, 22, and 24 that integrate the present lighting systems can yield a different message as illuminated visual images 20a, 22a, 24a when the lighting systems are programmed according to a predetermined configuration to illuminate light sources for the purpose of illuminating a predetermined illuminated visual image.

Since FIGS. 3 and 4 are illustrations of the same aircraft, FIGS. 3 and 4, respectively, show how the illumination regions 40 and 44 that integrate the present lighting systems can yield a different message in as illuminated visual images 40a, 44a when the lighting systems are programmed according to a predetermined configuration to illuminate light sources for the purpose of illuminating a predetermined illuminated visual image.

FIGS. 5A, 5B, 5C, 5D, 5E, and 5F show cross-sectional views of the disclosed lighting system assemblies, apparatuses, and methods according to present aspects. According to one aspect, the lighting assembly 100 shown in FIG. 5F is made through a series of progressive steps outlined in non-limiting fashion in FIGS. 5A, 5B, 5C, 5D, 5E, and 5F.

As shown in FIG. 5A, lower flexible base coating layers 112 and upper flexible coating layer 114, respectively, are disposed proximately to one another, and further in intimate contact with one another, and bonded together. Upper flexible coating layer 114 comprises small perforations or through-openings that, as shown in FIGS. 1C and 1D appear as recesses 116 bounded by recess wall 115 (formed in the upper flexible coating layer 114 material) and a recess floor 112a (formed by the upper surface of the lower flexible base coating layer 112 material). That is, as shown in FIG. 5A, the upper flexible coating layer 114 is bonded or laminated to an upper surface of the lower flexible base coating layer 112 to form the plurality of recesses with closed recess bottoms equivalently referred to herein as recess "floors".

In one present aspect, the lower flexible base coating layer 112, and upper flexible coating layer 114, respectively can each comprise a polyvinyl fluoride (PVF) material, such as Tedlar film, made by Du Pont.

Strong, flexible, dielectric substrate materials may also be employed for the lower flexible base coating layer 112 and upper flexible coating layer 114, (e.g., Kapton, Mylar or polyvinyl chloride (PVC) materials, etc.). The through openings shown as recesses 116 formed in the upper flexible coating layer 114 can be formed in a variety of controlled manufacturing methods including, for example and without limitation, by laser ablation.

As illustrated in FIG. 5B, a light source adhesive 118 is then placed in the recess 116. As illustrated in FIG. 5C, a light source 120, that can be a microminiature light source, and that is referred to equivalently and interchangeably herein as an "illumination source" (e.g., micro-LED, micro-OLED, etc.), is placed onto the light source adhesive 118 in the recess 116, for example, using a conventional pick-and-place machine (not illustrated).

As shown in FIG. 5D, conductive traces 122 (that can be, for example, electrically conductive traces) are then written over the top surface of the upper flexible coating layer 114 to form electrical connections with the respective light source leads 120a, (e.g., the anode and cathode), of each light source 120. As discussed below, the conductive traces 122 electrically interconnect or otherwise place the light sources 120 in direct or indirect communication with a power source and control circuitry (shown in FIG. 5F) such that each light source can, for example, be controlled independently of the others. Alternatively, groups of light sources 120 associated in the completed lighting assembly 100 (as shown in FIG. 5F) can be controlled independently of each other.

In an alternative aspect (not illustrated), the light sources 120 can be mounted on the upper surface of the lower flexible base coating layer 112 and then interconnected by writing the conductive traces 122 over the top surface of the lower flexible base coating layer 112 before the upper flexible coating layer 114 is bonded thereto. The upper flexible coating layer 114 can then be laminated over the lower flexible base coating layer 112, conductive traces 122 and light source 120 such that each light source is received in a respective recess 116 in the lower flexible base coating layer 112 and then encased in a coating that is the upper flexible coating layer 114.

In one aspect, as illustrated in FIG. 5E, each light source 120 can be "potted" or otherwise secured in place in its respective recess 116 by depositing a clear filler material 124 around the light source to substantially fill any gaps around the light source 120 and to provide a relatively smooth upper surface in the area of the light source 120.

As shown in FIG. 5F, an exterior coating layer 123 (that can be, for example, and without limitation, a clear coat, etc.) is disposed onto the conductive trace 122. The exterior coating layer 123 can have a light transmissivity ranging from about 30% to about 70%. In another aspect, the exterior coating layer 123 can be substantially transparent and have a light transmissivity ranging from about 70% to about 95%. In another aspect, the exterior coating layer 123 can be transparent and have a light transmissivity ranging from about 95 to about 99%.

Depending upon the materials selected, the resulting completed lighting assembly 100 shown in FIG. 5F can then be cured (e.g., by UV radiation, for example, if UV curing adhesives are used, etc.), or alternatively, the resulting completed lighting assembly 100 can be co-cured with heat (e.g., in a crush core or autoclave process under vacuum, etc.), or the resulting lighting assembly 100 in a completed form can be secondarily cured with or otherwise bonded to an underlying composite substrate material 130 onto which the lighting assembly 100 is placed, preferably as a film or film laminate. If desired, a substrate adhesive 132 can be applied as a layer that can be interposed between the composite substrate material 130 and the lighting assembly 100. According to a present aspect, the composite substrate material 130 can include a composite substrate material of a vehicle exterior surface and, for example, an aircraft exterior surface, with the composite substrate material 130 preferably comprising an epoxy resin-based composite substrate material.

A power source 126, that can be located remotely from the lighting assembly 100, is shown in FIG. 5F in direct communication with the conductive traces 122 directly or through intermediate contact with a light source lead 120a connecting the power source 126 to the conductive traces 122. A controller 125 is shown in communication with the power source 126 and the conductive traces 122, with the controller 125 configured to control the power and signals feeding to the conductive traces 122 and also configured to receive signals from a programmable computer 127 that can deliver any predetermined or desired illumination sequence that is programmed to be visually outputted from the lighting assembly 100, as the LEDs can illuminate in any predetermined pattern, sequence, progression, etc., through a programmable and otherwise controlled sequence (e.g., patterned, or pulsed on/off signaling, etc.) to form any predetermined collective visual image or series or sequences of visual images. Controller 125 further is shown comprising or otherwise in communication with a sequencer 128 that can be in communication with programmable computer 127. In further aspects, the controller 125 itself can conducts the sequencing function of the sequencer. In further aspects, the controller 125 can include a computer comprising computing functions.

Though not explicitly shown, there are numerous other fabrication and assembly options available that will arrive at the same or a substantially similar lighting assembly 100 configuration. For example, the upper flexible coating layer 114 may include a flap (not illustrated) located at an edge of the lighting assembly 100, upon which terminal ends of the conductive traces 122 are written, and that is arranged to wrap around an edge of a panel to a back side thereof, so as to provide a location for the installation of the power and control electronics of the panel. This "wraparound" circuit board configuration may then be populated by either bonding the electronic components to the substrate and then writing conductive traces 122 (that can be interconnecting conductive traces) upon their respective leads, or by printing the circuit traces onto the upper flexible coating layer 114 and then attaching the electronics thereto using, for example, a conductive adhesive, etc. It should also be noted that direct-write manufacturing techniques contemplated herein are capable of printing many of the passive electronic power and control components themselves, such as, for example, resistors, capacitors, antennas, ground planes, shielding, and the like, and minimizing the number of discrete components used in the lighting assembly 100.

By way of example of a present aspect, and according to a non-limiting illustrative method and system for manufacturing a presently disclosed layer incorporating electronic circuitry, FIG. 6 shows a manufacturing environment, 200 for a lighting assembly 225 wherein an electronic circuit-containing substrate material 202 can be made. The electronic circuit-containing substrate material 202 can be made using a thermoforming machine 204, with the thermoforming machine 204 as shown including substrate holder 206, vacuum mold, heater 210, and vacuum system 212. Electronic circuit-containing substrate material 202 can be formed from a flexible electronic circuit-containing layer 214 and a composite laminate 216. The flexible electronic circuit-containing layer 214 includes electronic circuitry 220 printed onto thermoplastic material film 218 (that can be, for example, polyetherimide (PET), etc.). In other non-limiting examples, the thermoplastic material film 218 can be polyester, polycarbonate, polypropylene, polyphenylene sulfide, etc. or combinations thereof.

Electronic circuitry 220 can comprise any number of components including, for example and without limitation, conductive wiring, an electronic trace, a resistor, a capacitor, an inductor, a voltage source, etc. In the case where the electronic component is an electronic trace, or a plurality of traces, conductive ink-based materials or some other type of conductive material can be directly "written" onto, for example, the substrate material (e.g., composite material) or into a film layer material (e.g., the thermoplastic material film 218) that can be applied to a substrate material exterior.

Electronic circuitry 220 can be applied onto the thermoplastic layer (e.g., by direct wire process) using a printer, including, for example, and without limitation printers used in connection with additive manufacturing to, for example 3-D print electronic circuitry onto a thin thermoplastic material film layer, that can be the thermoplastic material film 218. Such printed circuit technology can form flexible electronic circuitry into and onto single layer or multi-layer substrates including thermoplastic films to be applied to composite material substrates, or, if desired, the printed circuits can be printed onto the composite materials with thermoplastic layers or other layers applied to protect the layer comprising the printed electronic circuits. applied to as well as composite Flexible electronic circuit-containing layer 214 can be placed in thermoforming machine 204 with, as shown in FIG. 6, substrate holder 206 used to fold flexible electronic circuit-containing layer 214 in place. Composite laminate 216 that can be a composite prepreg laminate material and can include a composite material exterior geometry 227 that is irregular, complex, contoured, or planar, or combinations thereof across its area. Composite laminate 216, as shown in FIG. 6, is layed up over vacuum mold 208.

Heater 210 is used to heat a flexible electronic circuit-containing layer 214 while flexible electronic circuit-containing layer 214 is held in place by substrate holder 206. Heater 210 heats the flexible electronic circuit-containing layer 214 to a predetermined temperature that will not damage the circuitry or melt the flexible electronic circuit-containing layer 214, but that can increase pliability of the film and otherwise increase film tack, possibly in a semi-molten state to facilitate positioning (especially positioning in difficult to access regions or regions where gravity can frustrate places such as the exterior underside of aircraft parts including, for example the underside of fuselages, wings, stabilizers, etc. Such a predetermined temperature can range from about 250° F. to about 400° F.

Once the flexible electronic circuit-containing layer 214 is sufficiently pliable, thermoforming machine 204 raises vacuum mold 208 such that the composite laminate 216 (also referred to equivalently here as the "composite laminate material") is raised into contact with the flexible electronic circuit-containing layer 214. Vacuum system 212 can be used, for example, with curing and molding protocols to conform the flexible electronic circuit-containing layer 214 to a composite material exterior geometry 227 that can be a predetermined or desired complex composite material outer or exterior contour, or other predetermined or desired geometry of the composite laminate 216. The combined heat and vacuum protocols can be maintained until the layer or layer comprising the electronic circuits and components are bonded or otherwise adhered to a composite laminate substrate exterior. Further layers, surface treatments, additives, surfacing protocols, etc. can be included, without limitation, particularly but not exclusive in the case where electronic circuitry is printed onto a layer that does not itself bond to a composite material, substrate or other material substrate (e.g., a metallic or other non-metallic substrate material) but that, instead, must be indirectly bonded with (e.g., with the aid of an adhesive or other material layer able to bond to composite material or other material substrates and also bond to the layer comprising the electronic circuitry, etc.).

In one example, a bonding layer 222 is formed by applying coating 224 to composite laminate 216. Coating 224 can be, for example, and without limitation, an adhesive material selected to bond to both the composite laminate 216 and the flexible electronic circuit-containing layer 214.

According to present aspects, the flexible electronic circuit-containing layer 214 can be implemented into exterior structures of, for example, an aircraft to produce a medium for composing any predetermined visual image on the exterior of the aircraft, limited only by programmable sequencing limitations. That is, any predetermined visual imaging sequence that can be programmed into presently disclosed systems can produce predetermined text messages, logos, indicia, insignias, scenes, artwork, images having the appearance of movement (e.g., through a programmed sequencing progression, etc.).

In each of the exemplary aspects herein, one or more of several direct conductive trace-writing methods can be used. For example, plasma spraying can be used to deposit a wide range of conductive or non-conductive materials directly onto conformal surfaces. One such plasma spraying direct write technology is available through, for example, Mesoscribe Technologies (Stony Brook, N.Y.).

Aerosol Spraying also can also be used to deposit a wide range of materials with extremely fine feature size (e.g. ranging from about 4 to about 5 microns), either on flat substrates or on conformal surfaces. This technology is available through, for example, Optomec, (Albuquerque, N. Mex.).

Ink jet printing technology is available from a wide variety of vendors and can also be used to print to flat substrates and can be adhered to conformal surfaces.

Electronics located within or outside of the fixture then control the color and brightness of the emitted light. Pulse width modulation is typically used to control the brightness of each micro-LED within the fixture. Furthermore, each light fixture may be individually controlled.

The present lighting assemblies can tap only electrical power (in conjunction with a wireless, i.e., RF, control interface), or alternatively, can tap into both electrical power and lighting control, with exterior lighting assemblies lighting control software modified to accommodate the control of the lighting assemblies, as well as the existing exterior lighting (search lights, beacons, navigational lighting, etc.). In an alternative aspect, it is also possible (in a suitably configured aircraft) to distribute electrical power and control signals to the present exterior lighting assemblies through conductive aircraft structure disposed adjacent to the aircraft structures to which the exterior lighting assemblies are directly attached.

Control over the exterior lighting assemblies can involve overall LED brightness, blink rate, on/off operability in total, or in selected sequence, etc.) can be achieved, for example, by transmitting control commands or settings from the aircraft to the panel via a wireless link. In this aspect, individual LEDs or groups of LED include a receiver (e.g., a radio receiver, etc.) that receives such commands or settings. Antennae may be printed directly into the printed layers or onto an additional layer, or onto a substrate laminated thereto, along with other electrical conductors and components. Several wireless control architectures are feasible, and this option is particularly advantageous for retrofit installations, because it eliminates or substantially reduces the need for re-wiring of the aircraft to accommodate the present lighting assemblies.

Transmitting control commands or settings from the airplane can be delivered to the present lighting assemblies via communication over power line (COPL) technology. In this aspect, the electronics of the aircraft superimpose the control/setting signals of the lighting assemblies over the power signal coupled to the lighting assemblies. A COPL transceiver located on the panel then interprets these signals and controls the light sources of the panel in accordance therewith.

According to present aspects, the lighting assemblies can have a wired supply of electrical power and a wireless interface for communication and control. Thus, the present lighting assemblies can require only a low voltage electrical interface for power. Since the lighting assemblies typically draw very little power to begin with, power can be tapped from existing electrical systems. Tapping power from local sources and providing wireless control greatly simplifies retrofit of existing aircraft by reducing the need to run additional aircraft wiring.

FIG. 7 is a flowchart outlining a non-limiting method 400 according to present aspects including embedding a 402 lighting system into an exterior layer of a vehicle, with the lighting system comprising a plurality of embedded light sources embedded in at least one of the substrate material exterior or a coating layer disposed on the substrate material exterior. The lighting system further includes a plurality of electrically conductive traces written into at least one of: the substrate material exterior or the coating layer, said plurality of electrically conductive traces in communication with the plurality of embedded light sources, and further in communication with an electrical source. The method 400 further includes sending 404 an electrical signal from the electrical source to the plurality of embedded light sources, controlling 406 the illumination of the plurality of light sources, activating 408 one or more of the plurality of light sources, and producing 410 a predetermined illuminated visual image on the exterior of the vehicle, wherein said plurality of embedded light sources are substantially encased in a substantially transparent material. Method 400 is understood to employ the systems and apparatuses set forth in any of at least FIGS. 1A, 1B, 1C, 1D; 5A, 5B, 5C, 5D, 5E, 5F, and/or 6.

FIG. 7 further contemplates an additional optional step of, before and/or after sending electrical signals to a plurality of light sources, (and/or in concert with the function of controlling illumination of light sources), further including sequencing 405 electrical signals (that can be a programmable or a programmed sequence of electrical signals) from an electrical source and/or a computer to a plurality of light sources. In some aspect, the sequencing can be accomplished by integrating a sequencer into an electrical system that in communication with the light sources. In another aspect, the sequencer is a discrete component that is in communication with an electrical source and a controller. In a further aspect the sequencer can be integrated into the controller, or the controller otherwise performs sequencing functions. Non-limiting method 400 is understood to employ the systems and apparatuses set forth in any of at least FIGS. 1A, 1B, 1C, 1D, 2, 3, 4, 5A, 5B, 5C, 5D, 5E, 5F, and/or 6.

The present aspects may, of course, be carried out in other ways than those specifically set forth herein without departing from essential characteristics of the disclosure. The present aspects are to be considered in all respects as illustrative and not restrictive, and all changes coming within the meaning and equivalency range of the appended claims are intended to be embraced therein.

What is claimed is:

1. An aircraft livery substrate comprising:
   a contoured aircraft livery substrate exterior, said contoured aircraft livery substrate exterior further comprising;
      a lighting assembly, said lighting assembly comprising:
         an exterior coating layer disposed on the contoured aircraft livery substrate exterior, said exterior coating layer configured to cover the plurality of light sources, said exterior coating layer further configured to substantially encase the contoured substrate exterior;
   a plurality of light sources incorporated in at least one of: the contoured aircraft livery substrate exterior or the exterior coating layer;
   a plurality of electrically conductive traces written into at least one of:
   the contoured aircraft livery substrate exterior or the exterior coating layer, said plurality of electrically conductive traces in communication with the plurality of light sources;
      a power source in communication with the plurality of electrically conductive traces; and
      wherein the lighting assembly in operation is configured to change the appearance of an aircraft livery.

2. The aircraft livery substrate of claim 1, wherein said light sources are substantially encased in a material having a light transmissivity ranging from at least about 30% to about 70%.

3. The aircraft livery substrate of claim 1, further comprising:
   a controller in communication with at least one of: the plurality of electrically conductive traces or the power source.

4. The aircraft livery substrate of claim 1, wherein the plurality of light sources comprises at least one of:
   a plurality of light emitting diodes, a plurality of organic light emitting diodes, or combinations thereof.

5. The aircraft livery substrate of claim 1, wherein the plurality of light sources is embedded in at least one of: the contoured aircraft livery substrate exterior or the exterior coating layer.

6. A component comprising the aircraft livery substrate of claim 1.

7. An aircraft comprising the aircraft livery substrate of claim 1.

8. The aircraft livery substrate of claim 1, wherein the exterior coating layer comprises a film layer, said film layer substantially encasing the aircraft livery substrate.

9. The aircraft of claim 7, wherein the aircraft is selected from the group consisting of: a manned aircraft, an unmanned aircraft, a manned spacecraft, an unmanned spacecraft, a manned rotorcraft, an unmanned rotorcraft a satellite, and combinations thereof.

10. An exterior lighting system for an aircraft livery, said exterior lighting system comprising:
   a contoured aircraft livery substrate, said contoured aircraft livery substrate comprising a contoured aircraft livery substrate exterior;
   a coating layer disposed to contact the contoured aircraft livery substrate exterior;

a plurality of light sources incorporated in at least one of: the contoured aircraft livery substrate exterior or the coating layer;

a plurality of electrically conductive traces written into at least one of:

the contoured aircraft livery substrate exterior or the coating layer, said plurality of electrically conductive traces in communication with the plurality of light sources;

a power source in communication with the plurality of electrically conductive traces;

wherein said coating layer is configured to substantially encase the plurality of light sources, said coating layer further configured to substantially encase the contoured aircraft livery substrate exterior; and wherein the exterior lighting system in operation is configured to change the appearance of the aircraft livery.

11. The exterior lighting system of claim 10, wherein said light sources are substantially encased in a material having a light transmissivity of ranging from at least about 30% to about 70%.

12. The exterior lighting system of claim 10, further comprising:

a controller in communication with at least one of: the plurality of electrically conductive traces, the power source, or combinations thereof.

13. The exterior lighting system of claim 10, wherein the plurality of light sources comprises at least one of: a plurality of light emitting diodes, a plurality of organic light emitting diodes, or combinations thereof.

14. The exterior lighting system of claim 10, wherein the coating layer comprises a plurality of coating layers.

15. The exterior lighting system of claim 10, wherein the coating layer comprises at least one film.

16. The exterior lighting system of claim 10, wherein the plurality of light sources each comprise at least one light source lead, said light source lead in communication with at least one electrically conductive trace.

17. The exterior lighting system of claim 10, wherein each of the plurality of light sources have a height ranging from about 25 µm×25 µm to about 50 µm×50 µm.

18. The exterior lighting system of claim 10, wherein the plurality of light sources is embedded in at least one of: the substrate exterior, the coating layer, or combinations thereof.

19. A coating layer for an aircraft livery substrate, said coating layer comprising:

a plurality of light sources incorporated in the coating layer;

a plurality of electrically conductive traces written into the coating layer, said electrically conductive traces in communication with the plurality of light sources;

wherein the coating layer is configured to adjoin a contoured aircraft livery substrate; and wherein said coating layer is configured to substantially encase the plurality of light sources; and wherein the plurality of light sources in operation is configured to change the appearance of the vehicle livery.

20. The coating layer of claim 19, wherein the coating layer is configured to be an aircraft livery coating layer; and wherein the plurality of light sources is embedded in the aircraft livery coating layer.

21. The coating layer of claim 19, wherein said coating layer is a film layer, said film layer comprising at least one of: polyetherimide, polyester, polycarbonate, polypropylene, polyphenylene sulfide, toughened polyurethane, polyether ether ketone, or combinations thereof.

22. The coating layer of claim 21, wherein the film layer has a light transmissivity ranging from about of at least about 30% to about 70%.

23. A method for producing a visual image on an aircraft livery, the method comprising:

incorporating an exterior lighting system into an aircraft exterior, said exterior lighting system comprising an aircraft exterior, said aircraft exterior comprising:

a contoured substrate exterior:

a plurality of light sources, said plurality of light sources incorporated in at least one of: the contoured substrate exterior or a coating layer, said coating layer disposed on the contoured substrate exterior;

a plurality of electrically conductive traces written into at least one of: the contoured substrate exterior or the coating layer, said plurality of electrically conductive traces in communication with the plurality of light sources, and said plurality of electrically conductive traces further in communication with a power source;

sending a signal from at least one of: the power source or a controller to the plurality of light sources;

controlling illumination of the plurality of light sources;

activating one or more of the plurality of light sources;

producing a predetermined illuminated visual image on the aircraft livery; and wherein said plurality of light sources are substantially encased in at least one of:

the contoured substrate exterior or the coating layer.

24. The method of claim 23, wherein at least one of: the contoured substrate exterior or the coating layer comprises a light transmissivity ranging from at least about 30% to about 70%.

25. The method of claim 23, wherein the predetermined illuminated visual image comprises at least one of: an advertisement, a customized message, an animated message, or combinations thereof.

26. The method of claim 23, wherein, in the step of controlling illumination of the plurality of light sources, further comprising:

sequencing a plurality of signals from the power source to the plurality of light sources.

27. The method of claim 26, wherein the sequencing comprises:

a programmable sequence; and wherein the controller is configured to sequence the programmable sequence.

\* \* \* \* \*